United States Patent [19]
Kimura

[11] Patent Number: 5,631,594
[45] Date of Patent: May 20, 1997

[54] TUNABLE LOGARITHMIC AMPLIFIER CIRCUIT USING CASCADED TRIPLE-TAIL CELLS

[75] Inventor: Katsuji Kimura, Tokyo, Japan

[73] Assignee: NEC Corporation, Tokyo, Japan

[21] Appl. No.: 629,197

[22] Filed: Apr. 8, 1996

[30] Foreign Application Priority Data

Jul. 18, 1995 [JP] Japan ................................. 7-203831

[51] Int. Cl.$^6$ .............................. G06F 7/556; G06G 7/24
[52] U.S. Cl. ............................................ 327/351; 327/352
[58] Field of Search ................................. 327/350–353, 327/560–563, 63, 65, 52, 354

[56] References Cited

U.S. PATENT DOCUMENTS

| | | | |
|---|---|---|---|
| 5,057,717 | 10/1991 | Kimura | 327/351 |
| 5,467,046 | 11/1995 | Kimura | 327/351 |
| 5,471,166 | 11/1995 | Kimura | 327/351 |
| 5,489,868 | 2/1996 | Gilbert | 327/351 |
| 5,521,542 | 5/1996 | Kimura | 327/351 |

FOREIGN PATENT DOCUMENTS

| | | |
|---|---|---|
| 62-293807 | 12/1987 | Japan. |
| 62-292010 | 12/1987 | Japan. |
| 4-165805 | 6/1992 | Japan. |

OTHER PUBLICATIONS

K. Kimura, "Some Circuit Design Techniques for Bipolar and MOS Pseudologarithmic . . . Voltage," *IEEE Trans on Cir and Sys —I: Fund Theory and Applns*, vol. 39, No. 9, Sep. 1992, pp. 771–777.

*Primary Examiner*—Toan Tran
*Attorney, Agent, or Firm*—Sughrue, Mion, Zinn, Macpeak & Seas

[57] ABSTRACT

A logarithmic amplifier circuit including a first triple-tail cell for rectifying an initial input signal to produce a first rectified output signal and a first amplified output signal, a second triple-tail cell for rectifying the first amplified output signal of the first triple-tail cell to produce a second rectified output signal and a second amplified output signal; and an adder for adding the first rectified output signal and the second rectified output signal. Each of the first and second triple-tail cells has first, second and third transistors whose emitters or sources are coupled together, said first and second transistors forming a differential pair. The differential pair and third transistor are driven by a single tail current. A base or gate of the third transistor are applied with ad c tuning voltage. Reduction of the circuit scale and total current consumption, low-voltage operation, and the logarithmic characteristics tuning can be realized.

6 Claims, 16 Drawing Sheets

TUNABLE LOGARITHMIC AMPLIFIER CIRCUIT USING CASCADED TRIPLE-TAIL CELLS

BACKGROUND OF THE INVENTION

1. Field of the Invention

The present invention relates to a logarithmic amplifier circuit and more particularly, to a tunable logarithmic amplifier circuit that is formed on a semiconductor integrated circuit device and that can provide a wide input dynamic range, good logarithmic accuracy, wide operating temperature range, and variable logarithmic characteristic.

2. Description of the Prior Art

In general, a logarithmic amplifier circuit includes n differential amplifiers cascade connected, n+1 full-wave rectifiers, and an adder, where n is an integer.

A first one of the n amplifiers produces an output signal in response to an initial input signal to be amplified. The remaining n+1 of the n amplifiers produce output signals in response to an amplified output signal by a preceding one of the amplifiers, respectively.

A first one of the n+1 full-wave rectifiers rectifies the initial input signal and produces a first rectified output signal. The remaining n of the n+1 full-wave rectifiers rectifies the output signals of the n differential amplifiers and produces n respective rectified output signals.

The adder adds the rectified output signals of the n+1 full-wave rectifiers to thereby produce an output signal with a logarithmic characteristic.

With a conventional logarithrmic amplifier circuit of this type, each of the full-wave rectifiers is formed by using two unbalanced differential pairs of bipolar or metal-oxide-semiconductor (MOS) transistors. The two transistors forming the differential pair have different emitter-area ratios or different gate-width (W) to gate-length (L) ratios, i.e, (W/L). The input ends of the two differential pairs are cross-coupled, and the output ends thereof are parallel-coupled.

This conventional logarithmic amplifier circuit was, for example, disclosed in the Japanese Non-Examined Patent Publication Nos. 62-293807 published in 1987, 62-292010 published in 1987, and 4-165805 published in 1992. The principle and operation of this conventional logarithmic amplifier circuit was described in detail in IEEE Transactions on Circuits and Systems-I, Vol. 39, No. 9, pp 771–777, September, 1992.

With the conventional logarithmic amplifier circuit described as above, the n differential amplifiers cascade connected and the n+1 full-wave rectifiers are necessary. As a result, not only the circuit scale becomes large but also the number of the necessary current sources increases.

Specifically, the conventional amplifier requires driving current sources for the individual differential. pairs. Also, the amplifier requires large capacitances to be added because the two transistors with relatively large emitter area ratios or gate-length to gate-width ratios have coupled collectors or drains. Accordingly, the total driving current tends to become large to improve the frequency characteristics occurs. This causes a problem that current consumption reduction is difficult to be realized.

Further, another problem that the basic logarithmic characteristics such as the logarithmic accuracy, slope of the characteristic curve, and dynamic range cannot be adjusted occurs.

SUMMARY OF THE INVENTION

The present invention was created to solve the above problems.

An object of the present invention is to provide a logarithmic amplifier circuit than enables to reduce the circuit scale and total current consumption.

Another object of the present invention is to provide a logarithmic amplifier circuit that is capable of low-voltage operation at a voltage as low as approximately 1 V.

Still another object of the present invention is to provide a logarithmic amplifier circuit that is capable of readily tuning its logarithmic characteristics.

The above objects together with others not specifically mentioned will become clear to those skilled in the art from the following description.

A logarithmic amplifier circuit according to the present invention includes (a) a first triple-tail cell for receiving an initial input signal to produce a first rectified output signal and a first amplified output signal, (b) a second triple-tail cell for receiving the first amplified output signal of the first triple-tail cell to produce a second rectified output signal and a second amplified output signal; and (c) an adder for adding the first rectified output signal and the second rectified output signal.

The first triple-tail cell has first, second and third transistors whose emitters or sources are coupled together. The first and second transistors form a first differential pair. The first differential pair and the third transistor are driven by a single tail current.

Bases or gates of the first and second transistors form input ends of the first triple-tail cell to be applied with the initial input signal.

Collectors or drains of the first and second transistors form output ends of the first triple-tail cell from which the first amplified output signal is derived. The first rectified output signal is outputted through a collector or drain of the third transistor.

A base or gate of the third transistor are applied with a first dc tuning voltage.

The second triple-tail cell has fourth, fifth and sixth transistors whose emitters or sources are coupled together. The fourth and fifth transistors form a second differential pair. The second differential pair and the sixth transistor are driven by a single tail current.

Bases or gates of the fourth and fifth transistors form input ends of the second triple-tail cell to be applied with the first amplified output signal.

Collectors or drains of the fourth and fifth transistors form output ends of the second triple-tail cell from which the second amplified output signal is derived. The second rectified output signal is outputted through a collector or drain of the sixth transistor.

A base or gate of the sixth transistor is applied with a second dc tuning voltage.

With the logarithmic amplifier circuit according to the present invention, each of the first and second triple-tail cells serves as a differential amplifier and a full-wave rectifier and as a result, the combination of the differential amplifier and full-wave rectifier can be replaced with s single triple-tail cell. Accordingly, the circuit scale and total current consumption can be reduced.

Also, since no stacked transistors are contained, this logarithmic amplifier circuit is capable of low-voltage operation at a voltage as low as approximately 1 V.

Further, the base or gate of the third and sixth transistors are applied with the first and second dc tuning voltage and therefore, this logarithmic amplifier circuit is capable of readily tuning its logarithmic characteristics.

In a preferred embodiment of the present invention, the first and second triple-tail cells are cascade connected through a differential amplifier circuit with an input offset. The input offset can be cancelled by adjusting the value of the emitter area ratio for bipolar transistors or the gate-width to gate-length ratio for MOS transistors.

In another preferred embodiment of the present invention, the first and second triple-tail cells are cascade connected directly. In this case, the coupling capacitors can be omitted.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
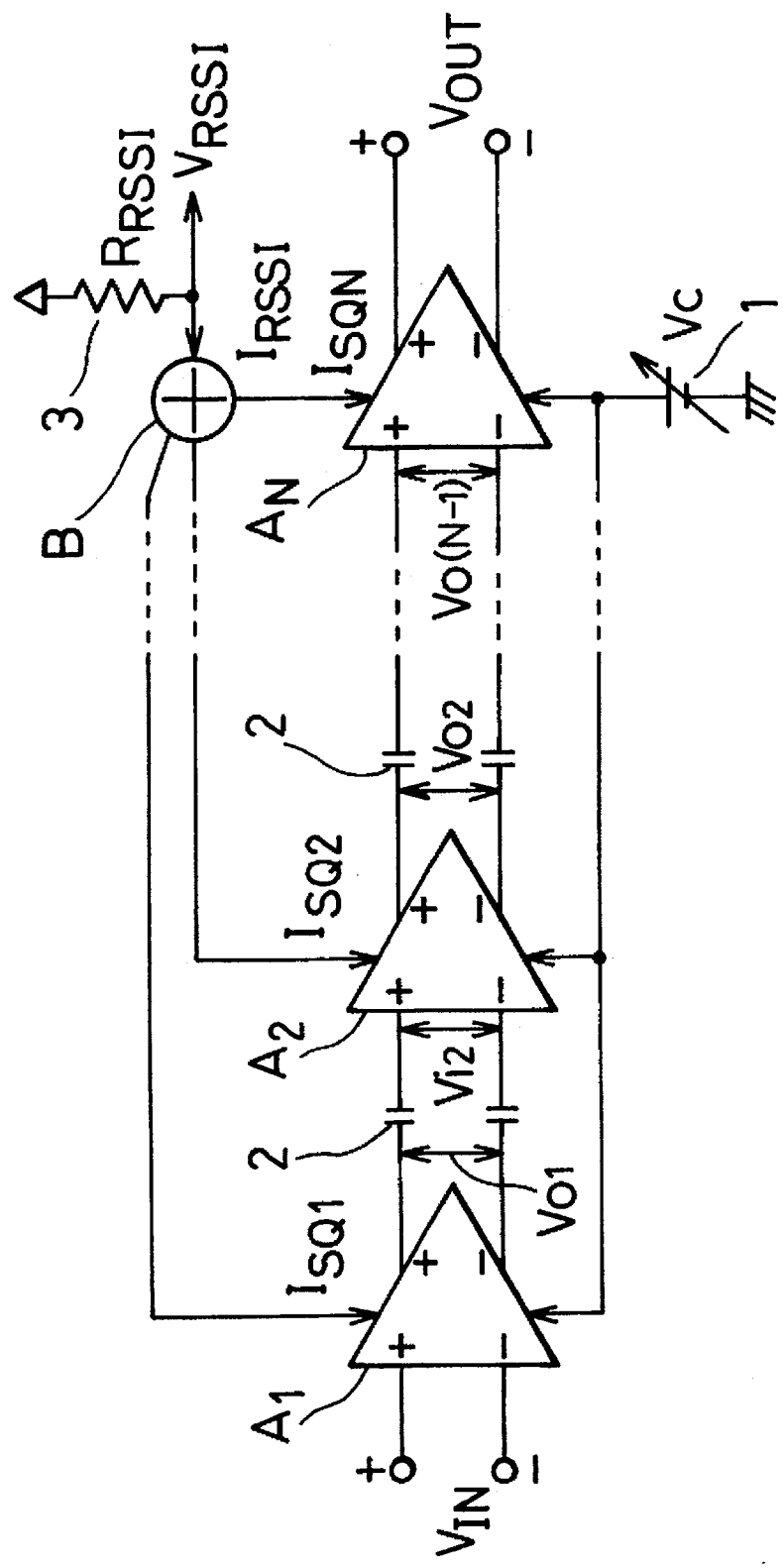
FIG. 1 is a block diagram showing the schematic circuit configuration of a logarithmic amplifier circuit according to a first embodiment of the present invention.

Preferred embodiments of the present invention will be described in detail below while referring to the drawings attached.

FIRST EMBODIMENT

A logarithmic amplifier circuit according to a first embodiment of the present invention is shown in FIG. 1.

As shown in FIG. 1, this amplifier circuit has first to N-th triple-tail cells $A_1$ to $A_N$ cascade connected, where N is an integer greater than or equal to two, an adder B, and a voltage source 1 for supplying a dc voltage $V_c$ to the respective cells $A_1$ to $A_N$.

Figure 3:
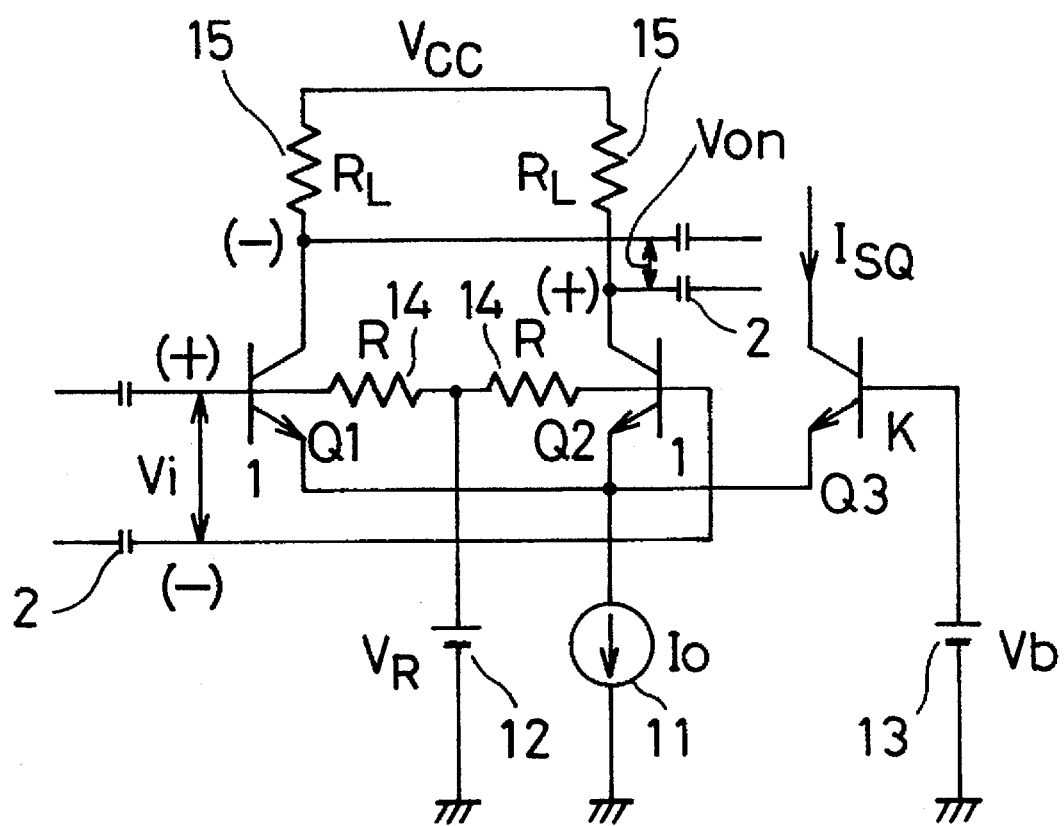
FIG. 3 is a circuit diagram of a bipolar triple-tail cell used for the logarithmic amplifier circuit according to the first embodiment of FIG. 1.

Each of the cells $A_1$ to $A_N$ has the same configuration as shown in FIG. 3. The adjoining two of the triple-tail cells $A_1$ to $A_N$ are connected to each other through a pair of capacitors 2.

This amplifier circuit further includes A voltage source 1 for supplying a dc control voltage $V_c$ to the respective triple-tail cells $A_1$ to $A_N$. This voltage source enables tuning of the logarithmic amplification characteristics.

The first triple-tail cell $A_1$ receives an input voltage $V_{i1}$, i.e., an initial input signal voltage $V_{IN}$ to be amplified logarithmically, thereby producing a first rectified output current $I_{SQ1}$ and a first amplified output voltage $V_{o1}$.

The second triple-tail cell $A_2$ receives the first output voltage $V_{o1}$, thereby producing a second rectified output current $I_{SQ2}$ and a second amplified output voltage $V_{o2}$.

Similarly, the N-th triple-tail cell $A_N$ receives the (n-1)-th output voltage $V_{o(N-1)}$, thereby producing an N-th rectified output current $I_{SQN}$ and an N-th amplified output voltage Vol, i.e., an output voltage $V_{OUT}$.

The adder B receives the first to N-th rectified output currents from the first to N-th triple-tail cells $A_1$ to $A_N$ and add them to thereby produce a rectified output current $I_{RSSI}$. This current $I_{RSSI}$ is supplied to a load resistor 3 with a resistance value of $R_{RSSI}$. An output voltage $V_{RSSI}$ indicating the result of logarithmic amplification of the initial input voltage $V_{IN}$ is derived from an end of the resistor 3.

In the following description, the individual input voltages of the first to N-th triple-tail cells $A_1$ to $A_N$ are generally indicated as $v_{in}$ where n is an integer from 1 to N, their individual output voltages are as $V_{on}$, and their individual rectified output currents are as $I_{SQn}$. The input voltage $V_{i1}$ of the first triple-tail cell $A_1$ is equal to the initial input signal voltage $V_{IN}$. The output voltage $V_{oN}$ of the last of N-th triple-tail cell $A_N$ is equal to an output signal voltage $V_{OUT}$.

As shown in FIG. 3, each of the first to N-th triple-tail cells $A_1$ to $A_N$ has a first differential pair of npn-type bipolar transistors whose emitters are coupled together, and an npn-type transistor Q3, as shown in FIG. 3. The emitter areas of the transistors Q1 and Q2 are equal to each other and therefore, this differential pair is of a balanced type. The emitter area of the transistors Q3 is K times as those of the transistors Q1 and Q2, where K is a constant equal to or greater than unity (i.e., K≧1). The transistors Q1 and Q2 are made of minimum-sized unit transistors.

Emitters of the transistors Q1, Q2 and Q3 are coupled together to be connected to one end of a constant current source 11 supplying a constant current $I_o$. The other end of the source 11 is grounded. The differential pair of the transistors Q1 and Q2 and the transistor Q3 forming the triple-tail cell are driven by this single tail current $I_o$.

Bases of the transistors Q1 and Q2 form input ends of the n-th triple-tail cell $A_n$ to be applied with the output voltage $V_{o(n-1)}$ of the (n-1)-th cell $A_{n-1}$.

Collectors of the transistors Q1 and Q2 form output ends of the cell $A_n$ through which the amplified output voltage $V_{on}$ is derived.

Two resistors 14 with the same resistance value of R are connected between the bases of the transistors Q1 and Q2. A dc reference voltage source 12 supplying adc bias voltage $V_R$ is connected between the connection point of the resistors 14 and the ground.

Two load resistors 15 are connected to the collectors of the transistors Q1 and Q2, respectively. The amplified output voltage $V_{on}$ is produced by these resistors 15.

A collector of the transistor Q3 form a further output end of the cell $A_n$ through which the rectified output current $I_{SQn}$ is derived.

A base of the transistor Q3 is applied with the dc control voltage $V_c$.

Figure 2:
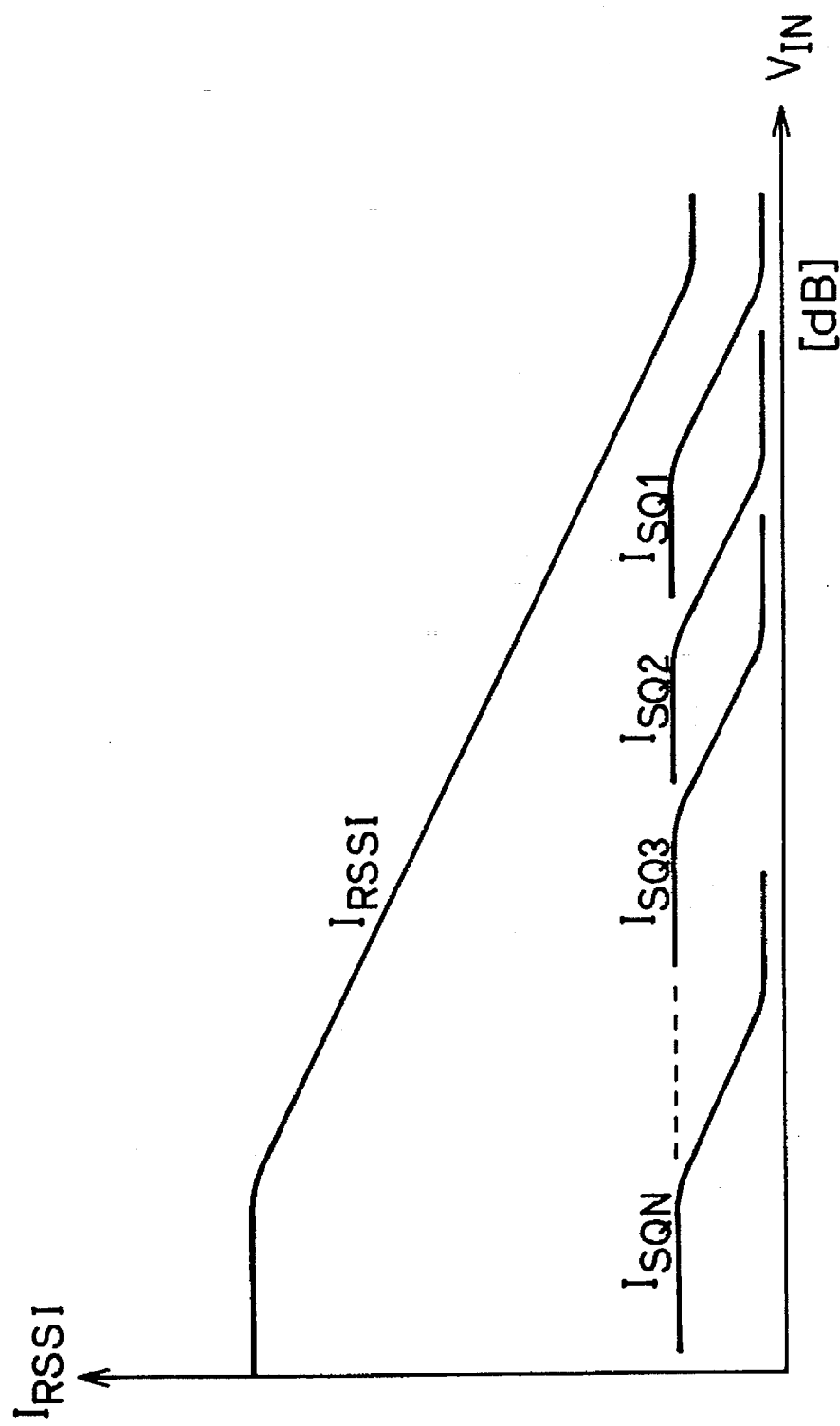
FIG. 2 is a characteristic diagram of the logarithmic amplifier circuit showing the relationship of the initial input voltage $V_{IN}$ with the rectified output currents of the respective triple-tail cells.

FIG. 2 shows the relationship of the initial input voltage $V_{IN}$ with the rectified output currents $I_{SQ}$ of the respective triple-tail cells $A_1$ to $A_N$ in the logarithmic amplifier circuit of FIG. 1. It is seen from FIG. 2 that the resultant amplified current $I_{RSSI}$ is obtained by summation of the first to N-th rectified output currents $I_{SQ1}$ to $I_{SQN}$.

Ignoring the base-width modulation of the bipolar transistors, collector currents $I_{ci}$ (i=1 to 3)of these bipolar transistors Q1, Q2 and Q3 are expressed by the following equations (1), (2) and (3), respectively, where $V_E$ is the common emitter voltage.

$$I_{C1} = I_S \exp\left(\frac{V_R + \frac{1}{2}V_i - V_S}{V_T}\right) \quad (1)$$

$$I_{C2} = I_S \exp\left(\frac{V_R - \frac{1}{2}V_i - V_S}{V_T}\right) \quad (2)$$

$$I_{C3} = KI_S \exp\left(\frac{V_R + V_C - V_S}{V_T}\right) \quad (3)$$

In the equations (1), (2) and (3), $V_T$ is the thermal voltage of the transistors Q1 to Q3 defined as $V_T = kT/q$ where k is the Boltzmann's constant, T is absolute temperature in degrees Kelvin and q is the charge of an electron. Also, $I_S$ is the saturation current, and $V_S$ is a common emitter voltage of the transistor Q1, Q2 and Q3.

The control voltage $V_C$ is expressed as $V_C = V_b - V_R$. The differential input voltages for the triple-tail cell $A_n$ is $\pm(\frac{1}{2})V_i$.

The tail current satisfies the following equation (4).

$$I_{c1} + I_{c2} + I_{c3} = \alpha_F I_o \quad (4)$$

where $\alpha F$ is the dc common-base current gain factor.

Sovling the equations (1) to (4) provides the following expression (5) for the term of $[I_S \exp\{(V_R - V_S)/V_T\}]$.

$$I_S \exp\left(\frac{V_R - V_S}{V_T}\right) = \frac{\alpha_F I_0}{2\cosh\left(\frac{V_i}{2V_T}\right) + K\exp\left(\frac{V_C}{V_T}\right)} \quad (5)$$

Accordingly, the collector currents are expressed as the following equations (6), (7) and (8).

$$I_{C1} = \frac{\alpha_F I_0 \exp\left(\frac{V_i}{2V_T}\right)}{2\cosh\left(\frac{V_i}{2V_T}\right) + K\exp\left(\frac{V_C}{V_T}\right)} \quad (6)$$

$$I_{C2} = \frac{\alpha_F I_0 \exp\left(-\frac{V_i}{2V_T}\right)}{2\cosh\left(\frac{V_i}{2V_T}\right) + K\exp\left(\frac{V_C}{V_T}\right)} \quad (7)$$

$$I_{C3} = \frac{K\alpha_F I_0 \exp\left(\frac{V_C}{V_T}\right)}{2\cosh\left(\frac{V_i}{2V_T}\right) + K\exp\left(\frac{V_C}{V_T}\right)} \quad (8)$$

Figure 4:
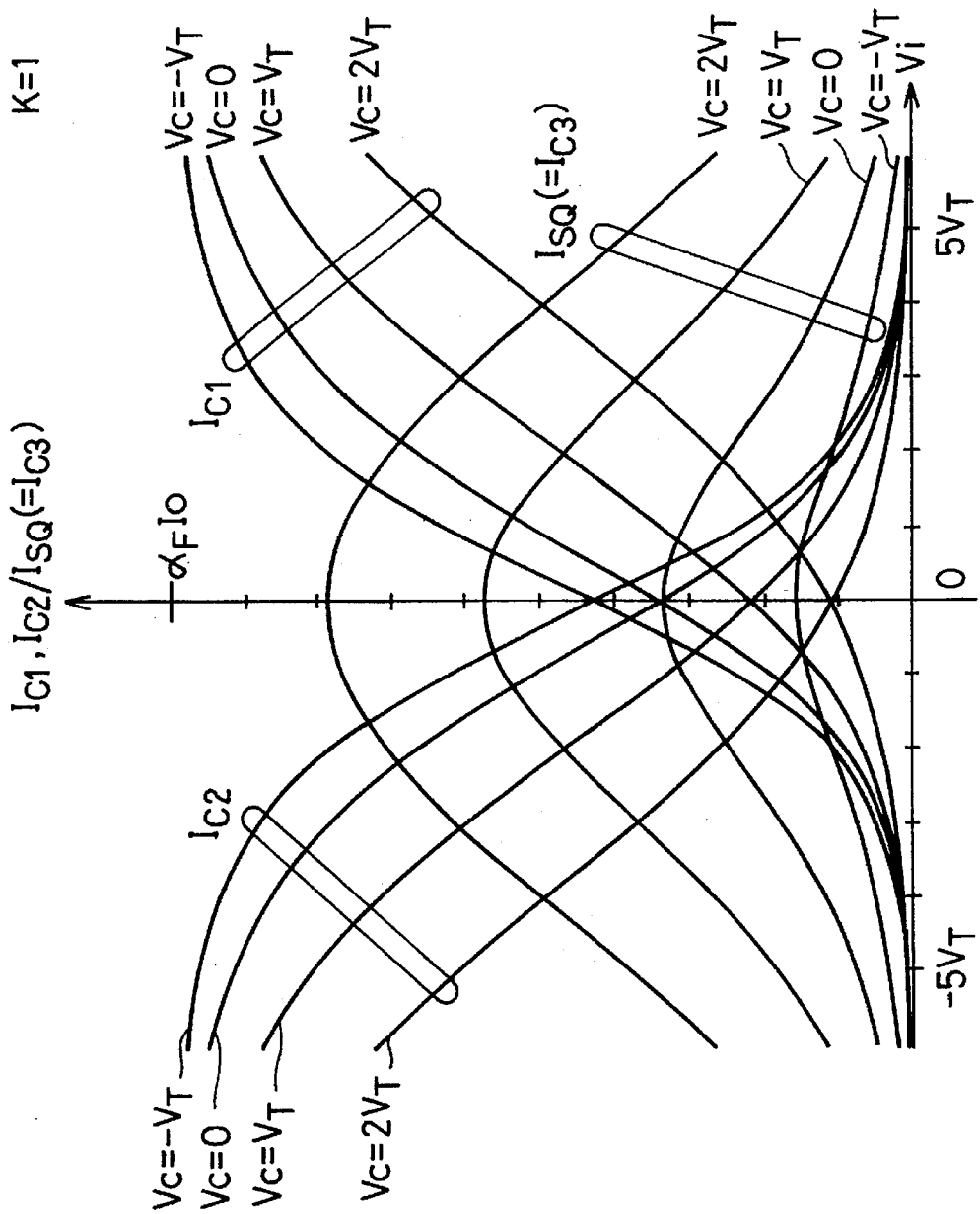
FIG. 4 is a graph showing the collector current and rectified output currents characteristics of the triple-tail cell of FIG. 3 with respect to the input voltage $V_i$.

FIG. 4 shows the collector current and rectified output currents characteristics of the triple-tail cell of FIG. 3 with respect to the input voltage $V_i$, where K=1.

The differential output current $\Delta I$ of the differential transistor pair of the transistors Q1 and Q2 is given by the following equation (9) as $$\Delta I_C = I_{C1} - I_{C2} \quad (9)$$

$$= \frac{2\alpha_F I_0 \sinh\left(\frac{V_i}{2V_T}\right)}{2\cosh\left(\frac{V_i}{2V_T}\right) + K\exp\left(\frac{V_C}{V_T}\right)}$$

Figure 5:
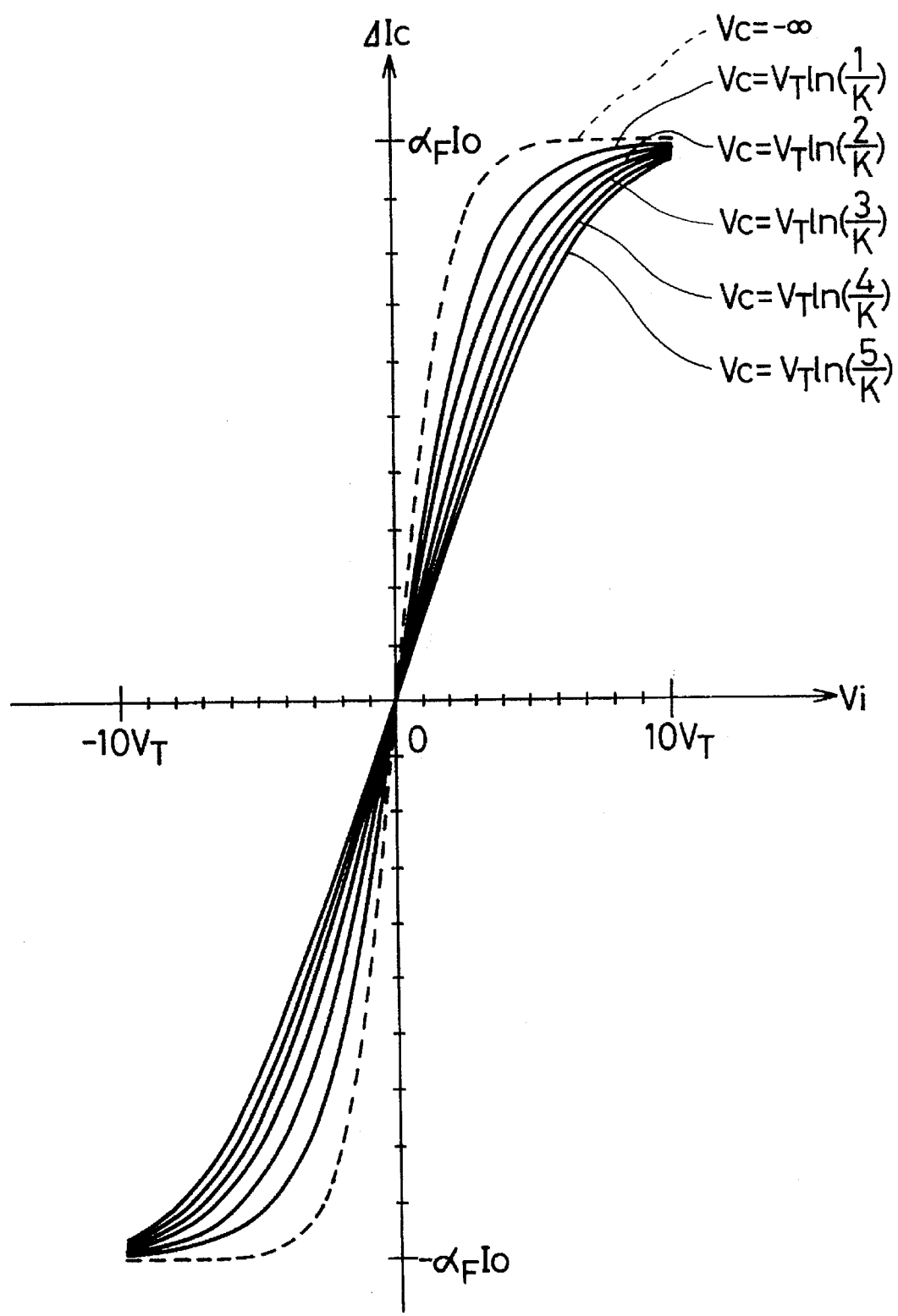
FIG. 5 is a graph showing the differential output current characteristics of the triple-tail cell of FIG. 3 with respect to the input voltage $V_i$.

FIG. 5 shows the differential output current characteristics of the triple-tail cell of FIG. 3 with respect to the input voltage $V_i$.

The transconductance characteristic of the differential pair is obtained by differentiating the equation (9) by the input voltage $V_i$ as $$\frac{d(\Delta I_C)}{dV_i} = \frac{\alpha_F I_0}{V_T} \frac{K\exp\left(\frac{V_C}{V_T}\right)\cosh\left(\frac{V_i}{2V_T}\right) + 2}{\left\{2\cosh\left(\frac{V_i}{2V_T}\right) + K\exp\left(\frac{V_C}{V_T}\right)\right\}^2} \quad (10)$$

Figure 6:
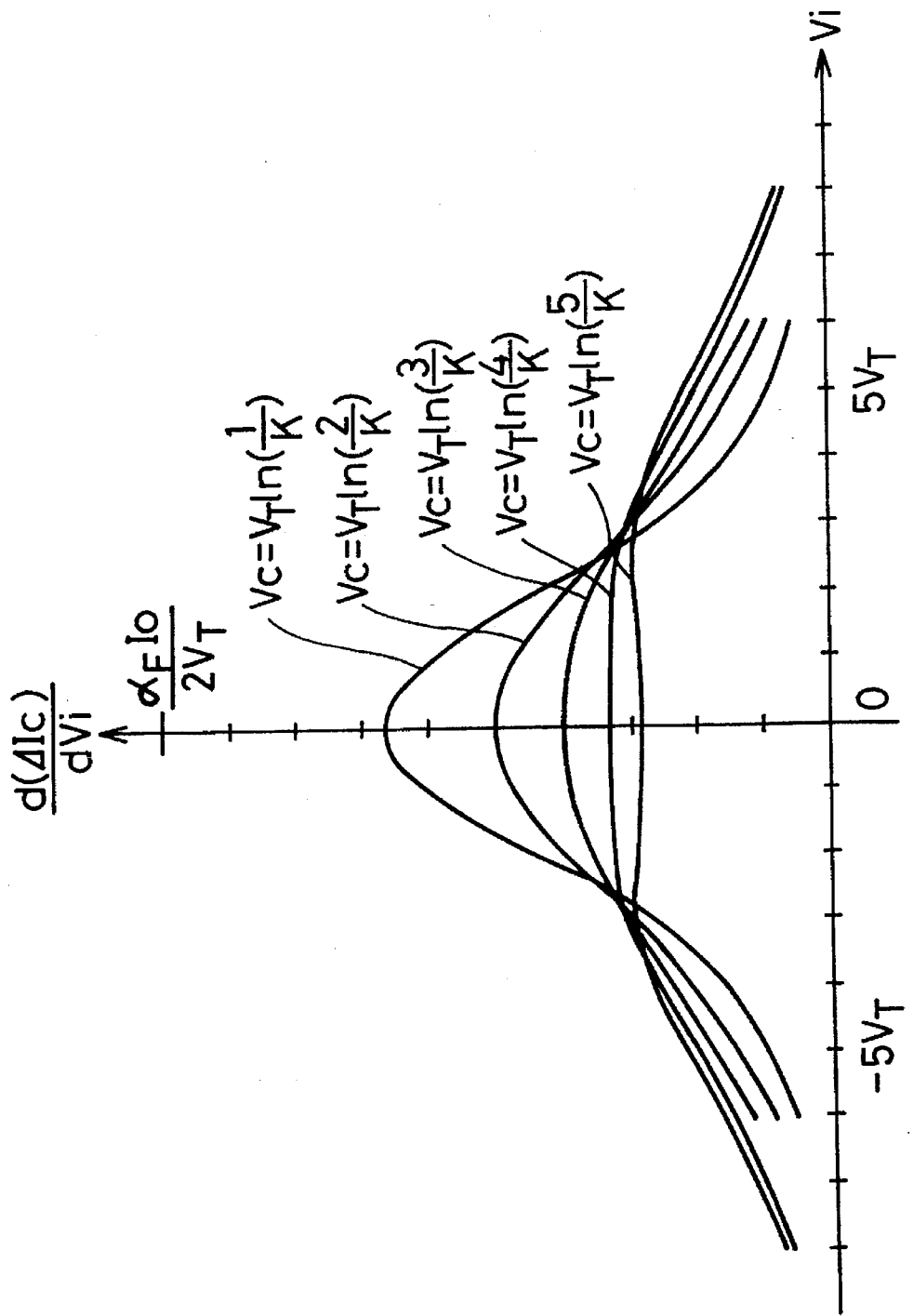
FIG. 6 is a graph showing the transfer characteristics of the triple-tail cell of FIG. 3 with respect to the input voltage $V_i$.

FIG. 6 shows the transfer characteristics of the triple-tail cell of FIG. 3 with respect to the input voltage $V_i$.

It is seen from FIGS. 5 and 6 that the differential output current $\Delta I$ varies dependent upon the dc control voltage $V_c$ and as a result, the transconductance can be varied by the voltage $V_c$.

The short-circuit transconductance characteristic of the triple-tail cell of FIG. 3 for small signal applications is obtained by differentiating the equation (9) by the input voltage $V_i$, where Vi=0 as $$\left.\frac{d(\Delta I_C)}{dV_i}\right|_{V_i=0} = \frac{\alpha_F I_0}{V_T} \frac{1}{2 + K\exp\left(\frac{V_C}{V_T}\right)} \quad (11)$$

Figure 7:
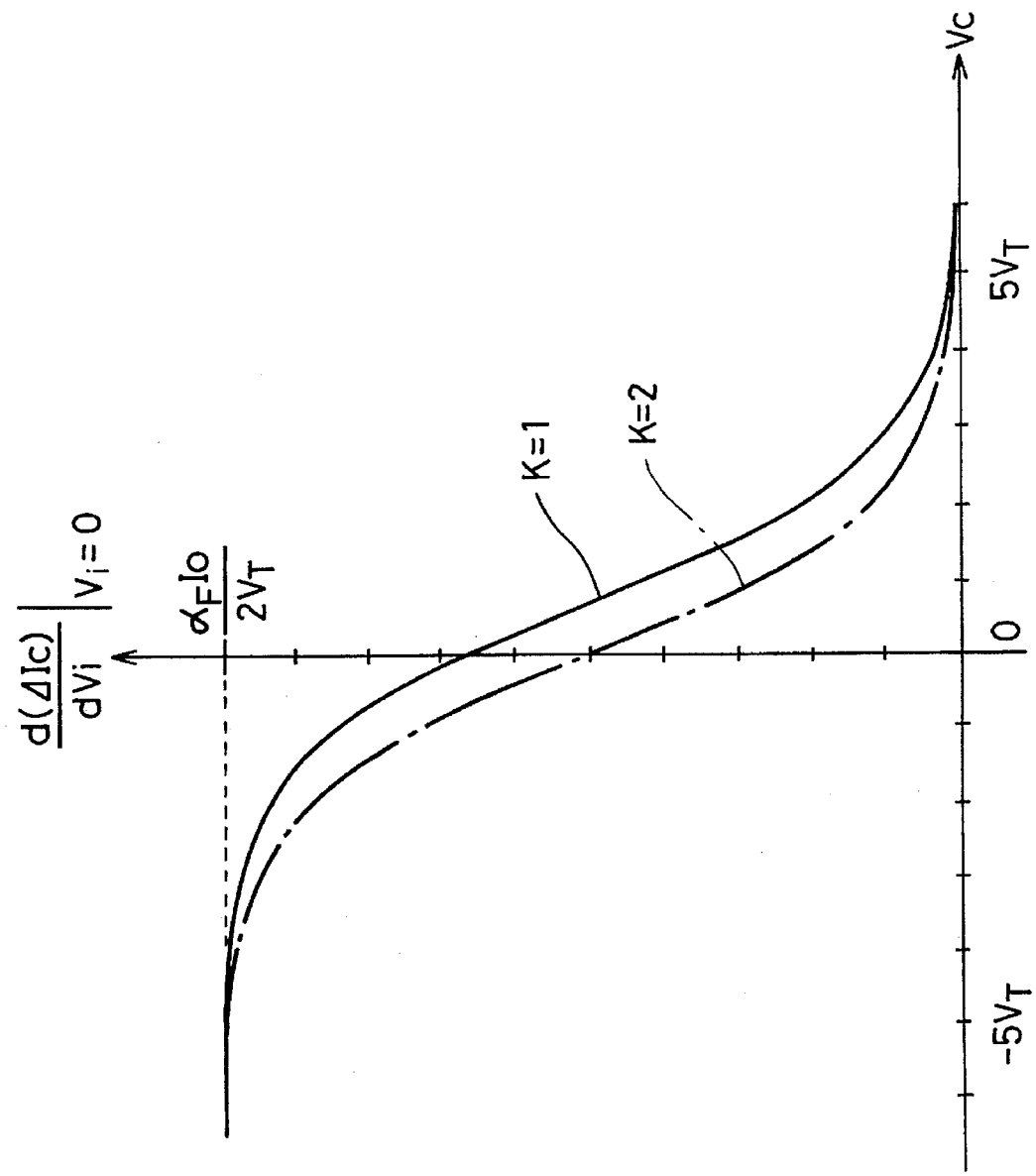
FIG. 7 is a graph showing the short-circuit transconductance characteristics of the triple-tail cell of FIG. 3 with respect to the voltage $V_c$.

FIG. 7 is a graph showing the short-circuit transfer characteristics of the triple-tail cell of FIG. 3 with respect to the voltage $V_c$.

The obtainable voltage gain for the small signal applications can be varied from the maximum value of $(\alpha_F I_o R_L/V_T)$ to the minimum value of 0 by changing the value of the control voltage $V_c$.

The rectified output current $I_{SQ}$ of the cell is expressed by the following equation (12) as $$I_{SQ} = I_{C3} \quad (12)$$

It is seen from FIG. 4 that the current $I_{SQ}$ has a full-wave rectification characteristic and is variable by the control voltage $V_c$. Therefore, the temperature dependency of the current $I_{SQ}$ can be cancelled by changing the dc control voltage $V_c$.

It is also seen that the input voltage range enabling approximation of the square-law characteristic can be varied by the voltage $V_c$.

Figure 8:
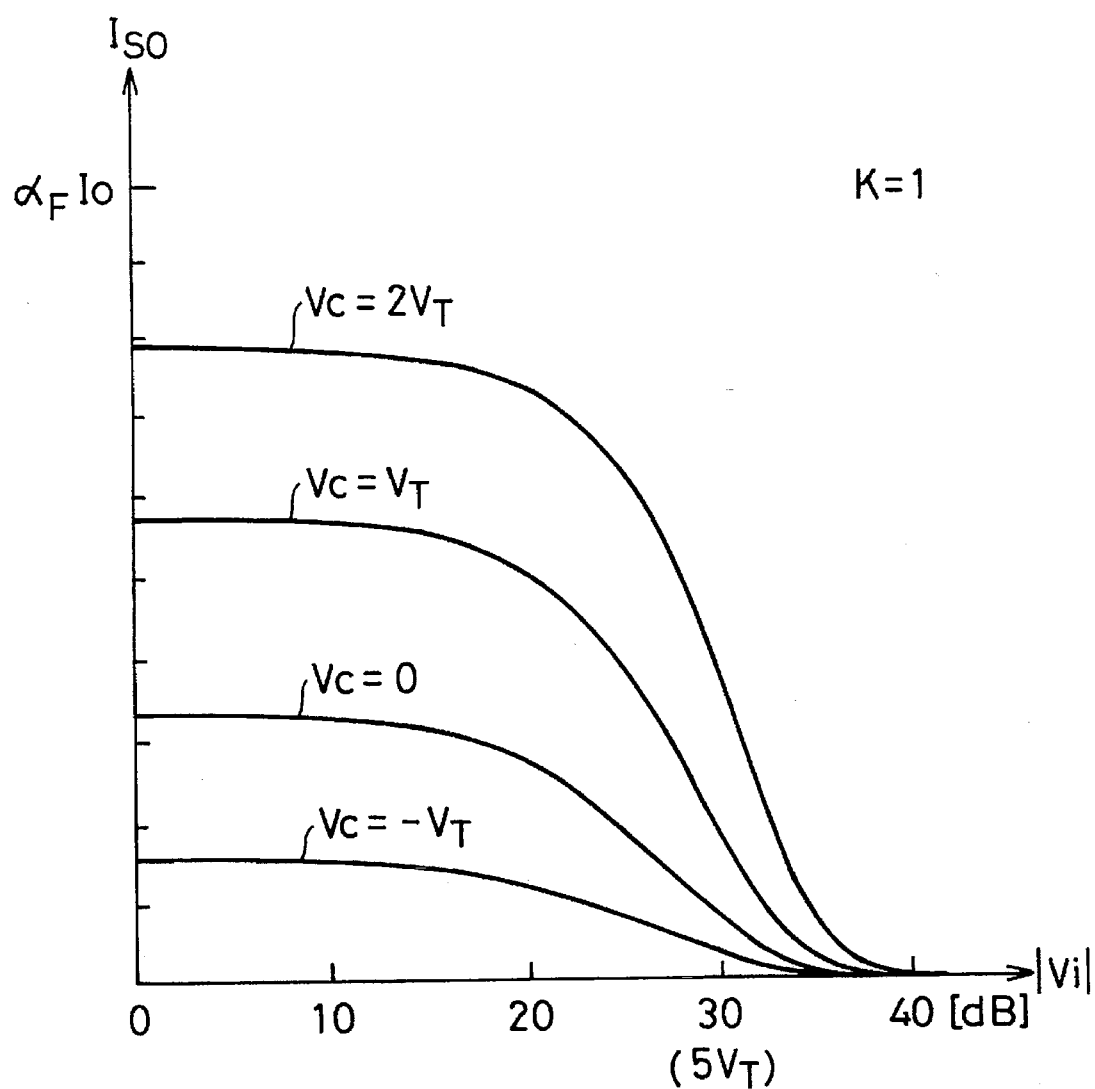
FIG. 8 is a graph showing the rectified output current characteristics of the triple-tail cell of FIG. 3 with respect to the input voltage $V_i$, which are illustrated in the dB expression.

FIG. 8 shows the rectified output current characteristics of the triple-tail cell of FIG. 3 with respect to the input voltage $V_i$, which are illustrated in decibel scale.

It is seen From FIG. 8 that the rectified output current $I_{SQ}$ has an input dynamic range equal to or greater than 10 dB. The respective logarithmic characteristics of the triple-tail cells $A_1$ to $A_N$ in the first to N-th stages are defined by their corresponding voltage gains, thereby changing the superposition of the respective output currents $I_{SQ}$. The total logarithmic characteristic of the amplifier circuit is defined by superposition of the logarithmic characteristics in the first to N-th stages.

As a result, by adjusting the value of the control voltage $V_c$, the logarithmic amplification characteristics such as logarithimic accuracy and slope can be changed. In other words, the triple-tail cell can be used as a full-wave-rectifier enabling the variable logarithmic amplification characteristics.

In this first embodiment, in consideration with the operating input voltage range, the logaraithmic input dynamic range is approximately ten and several decibels. Therefore, satisfactory logarithmic accuracy can be obtained if the voltage gain of the differential pair of the transistors Q1 and Q2 is set at approximately ten and several decibels.

As described above, in the logarithmic amplifier circuit according to the first embodiment, each. of the first and second triple-tail cells $A_1$ to $A_N$ serves as a differential amplifier and a full-wave rectifier and as a result, the circuit scale and total current consumption can be reduced.

Especially, since each of the transistors Q1 and Q2 is minimum-sized unit transistors, these effects of the reduced circuit scale and total current consumption are distinctively obtained.

Also, since no stacked transistors are contained, this logarithmic amplifier circuit is capable of low-voltage operation at a voltage as low as approximately 1 V.

Further, this logarithmic amplifier circuit is capable of readily tuning its logarithmic characteristics by varying the dc control voltage $V_c$.

SECOND EMBODIMENT

FIG. 5 shows a triple-tail cell used for a logarithmic amplifier circuit according to a second embodiment, which has a configuration obtained by replacing the bipolar transistors Q1, Q2 and Q3 in FIG. 3 with n-channel MOS transistors M1, M2 and M3, respectively. Therefore, the detailed explanation is omitted here for the sake of simplification.

The MOS transistors M1 and M2 have the same ratio (W/L) of a gate-width W to a gate-length L. The MOS transistor M3 has a ratio (W/L) K times as large as those of the transistors M1 and M2.

Assuming that all the transistors M1, M2 and M3 are matched in characteristic and are operating in the saturation region, and that they have the square-law characteristics, respectively, and ignoring the body-effect, the drain currents $I_{D1}$, $I_{D2}$ and $I_{D3}$ of the respective transistors M1, M2 and M3 can be expressed as the following equations (13), (14) and (15), respectively.

$$I_{D1} = \beta \left( V_R + \frac{1}{2} V_i - V_S - V_{TH} \right)^2 \tag{13}$$

$$I_{D2} = \beta \left( V_R - \frac{1}{2} V_i - V_S - V_{TH} \right)^2 \tag{14}$$

$$I_{D3} = K\beta(V_R + V_C - V_S - V_{TH})^2 \tag{15}$$

In the equations (13), (14) and (15), $\beta$ is the transconductance parameter of these MOS transistors. $\beta$ is expressed as $\mu(C_{ox}/2)(W/L)$ where $\mu$ is the effective carrier mobility, $C_{ox}$ is the gate oxide capacitance per unit area, and W and L are a gate-width and a gate-length of these transistors, respectively. Also, $V_{TH}$ is the threshold voltage of the transistors M1, M2 and M3.

A tail current of the cell is expressed as the following equation (16).

$$I_{D1} + I_{D2} + I_{D3} = I_0 \tag{16}$$

Figure 9:
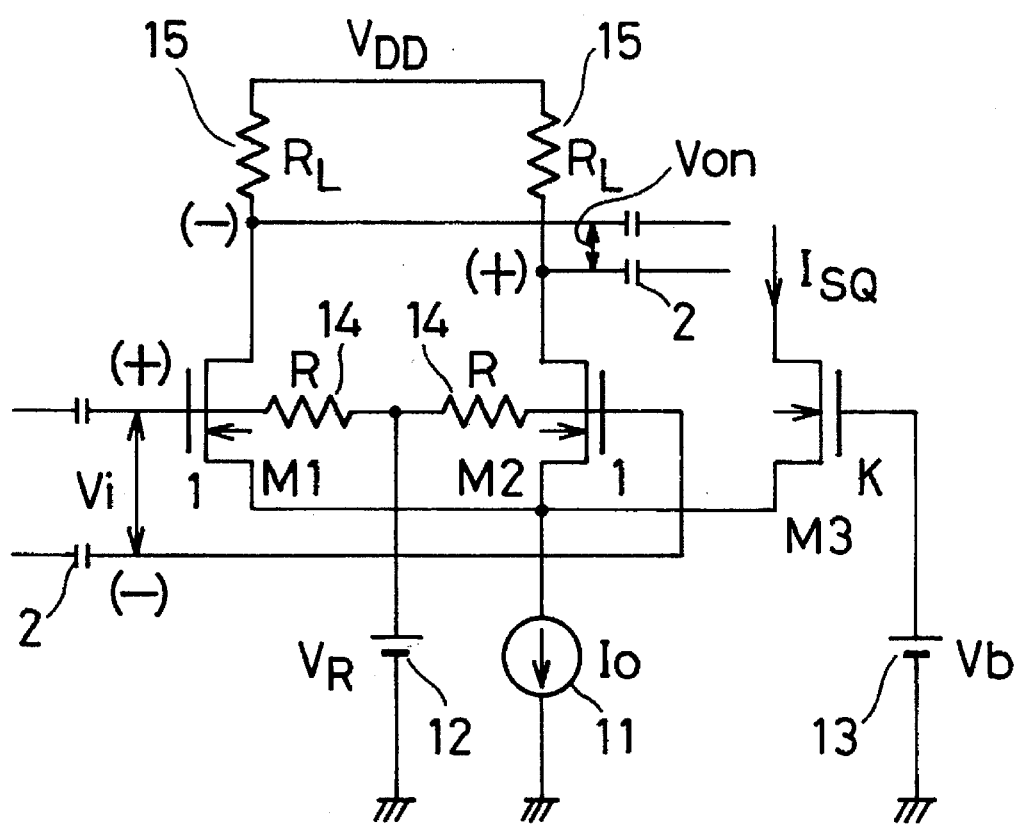
FIG. 9 is a circuit diagram of an MOS triple-tail cell used for a logarithmic amplifier circuit according to a second embodiment of the invention.

Solving the equations (13), (14), (15) and (16) provides one of the output current $\Delta I_D$ of the triple-tail cell of FIG. 9 as the following equations (17a), (17b) and (17c) as $$\Delta I_D = I_{D1} - I_{D2} \tag{17a}$$

$$= 2\beta V_i \left\{ -\frac{KV_C}{(K+2)} + \frac{1}{(K+2)} \sqrt{\frac{(K+2)I_0}{\beta} - \frac{(K+2)}{2} V_i^2 - 2KV_C^2} \right\} + \frac{2I_0}{(K+2)}$$

$$\left( |V_i| \leq \sqrt{\frac{2I_0}{\beta} - 4V_C^2} \;,\; |V_i| \leq \frac{-2KV_C + \sqrt{\frac{(K+4)I_0}{\beta} - 4KV_C^2}}{(K+4)} \right)$$

$$\Delta I_D = I_{D1} - I_{D2} \tag{17b}$$

$$= \frac{2}{(K+1)} I_0 - \frac{K(K-1)\beta(|V_i| - 2V_C)^2}{(K+2)^2} + \frac{K\beta(|V_i| - 2V_C)}{2(K+2)^2} \sqrt{\frac{(K+2)I_0}{\beta} - K(|V_i| - 2V_C)^2}$$

$$\left( \min \left\{ \sqrt{\frac{2I_0}{\beta} - 4V_C^2} \;,\; \frac{-2KV_C + \sqrt{\frac{(K+4)I_0}{\beta} - 4KV_C^2}}{(K+4)} \right\} \leq |V_i| \leq 2\sqrt{\frac{I_0}{\beta}} \right)$$

$$\Delta I_D = I_{D1} - I_{D2} \tag{17c}$$

$$= I_0 \, sgn(V_i) \quad \left( 2\sqrt{\frac{I_0}{\beta}} \leq |V_i| \right)$$

Figure 10:
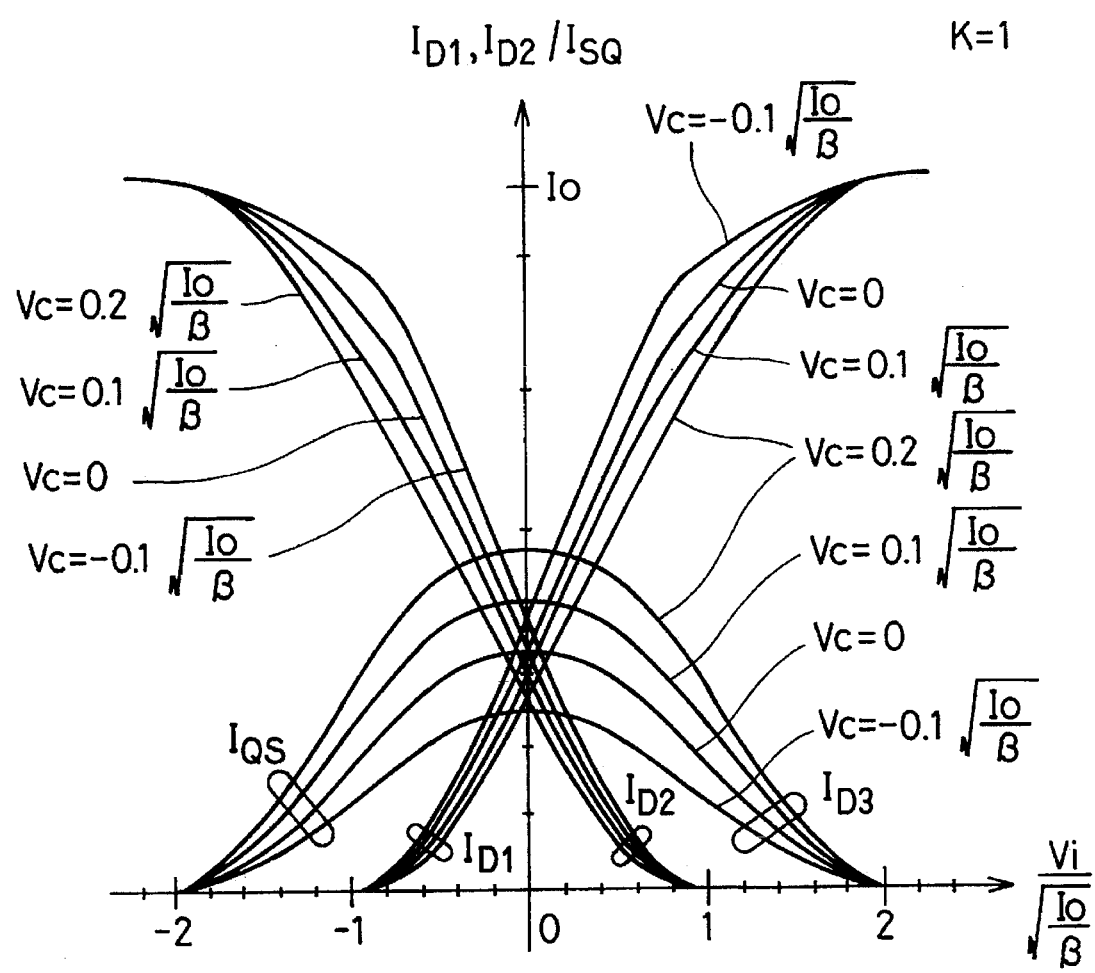
FIG. 10 is a graph showing the drain current and rectified output current characteristics of the triple-tail cell of FIG. 9 with respect to the input voltage $V_i$.

FIG. 10 shows the drain current and rectified output currents characteristics of the triple-tail cell of FIG. 9 with respect to the input voltage $V_i$, where K=1 and the the input voltage $V_i$ is expressed after normalization by $(I_o/\beta)^{1/2}$.

The differential output current $\Delta I$ of the triple-tail cell of FIG. 9 is given by the following equations (18a), (18b) and (18c) as $$\frac{d(\Delta I_D)}{dV_i} = 2\beta \left\{ -\frac{KV_C}{(K+2)} + \frac{1}{(K+2)} \sqrt{\frac{(K+2)I_0}{\beta} - \frac{(K+2)}{2} V_i^2 - 2KV_C^2} - \frac{V_i^2}{\sqrt{\frac{(K+2)I_0}{\beta} - \frac{(K+2)}{2} V_i^2 - 2KV_C^2}} \right\} \quad (18a)$$

$$\left( |V_i| \leq \sqrt{\frac{2I_0}{\beta} - 4V_C^2} \;,\; |V_i| \leq \frac{-2KV_C + \sqrt{\frac{(K+4)I_0}{\beta} - 4KV_C^2}}{(K+4)} \right)$$

$$\frac{d(\Delta I_D)}{dV_i} = -\frac{2K(K-1)\beta(|V_i|-2V_C)||V_i|-2V_C|}{(K+2)^2} + \quad (18b)$$

$$\frac{K\beta sgn(V_i)}{2(K+2)^2} \sqrt{\frac{(K+2)I_0}{\beta} - K(|V_i|-2V_C)^2} - \frac{K^2\beta(|V_i|-2V_C)^2}{2(K+2)^2 \sqrt{\frac{(K+2)I_0}{\beta} - K(|V_i|-2V_C)^2}}$$

$$\left( \min\left\{ \sqrt{\frac{2I_0}{\beta} - 4V_C^2} \;,\; \frac{-2KV_C + \sqrt{\frac{(K+4)I_0}{\beta} - 4KV_C^2}}{(K+4)} \right\} \leq |V_i| \leq 2\sqrt{\frac{I_0}{\beta}} \right)$$

$$\frac{d(\Delta I_D)}{dV_i} = 0 \quad \left( 2\sqrt{\frac{I_0}{\beta}} \leq |V_i| \right) \quad (18c)$$

Figure 11:
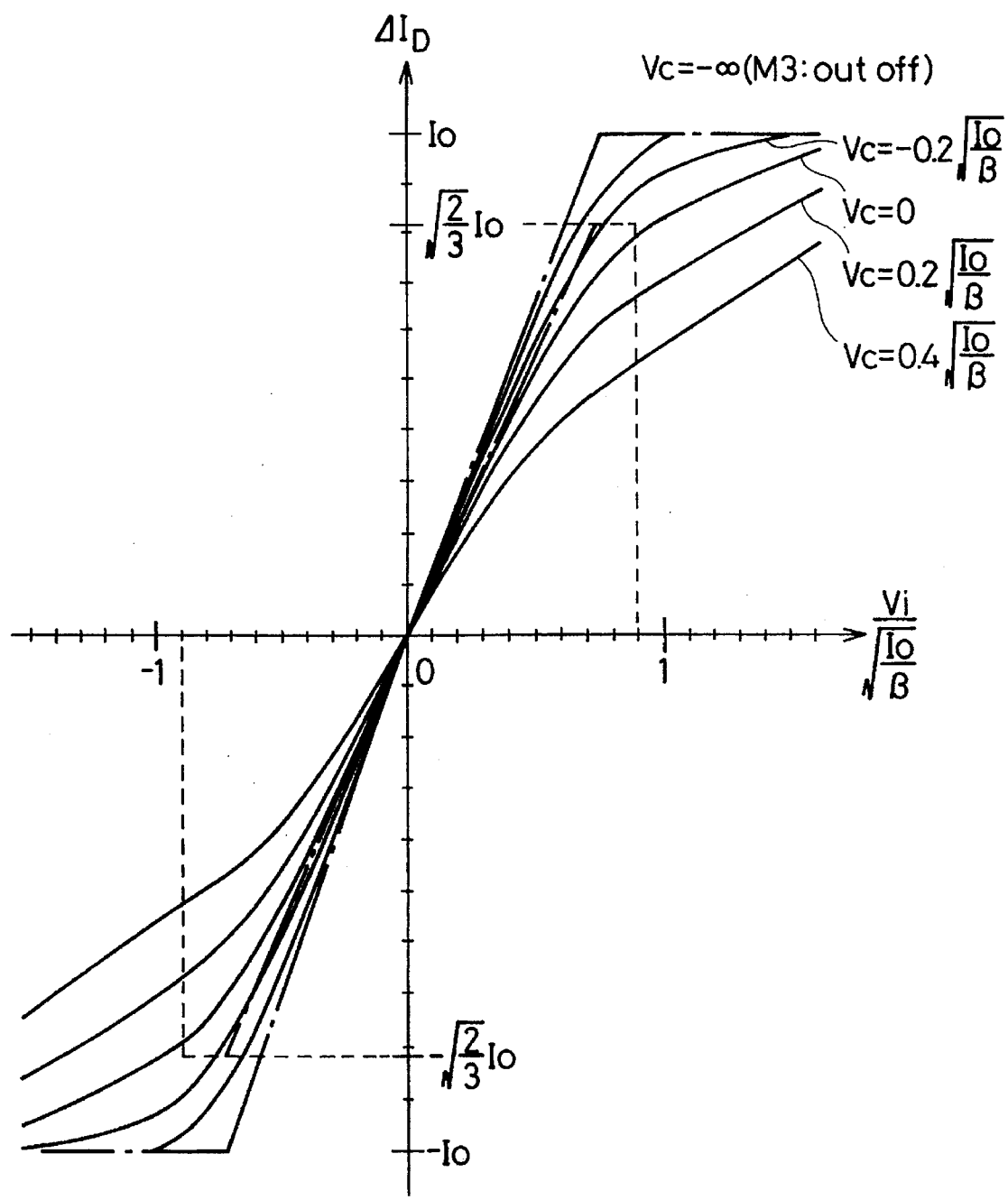
FIG. 11 is a graph showing the differential output current characteristics of the triple-tail cell of FIG. 9 with respect to the input voltage $V_i$.

FIG. 11 shows the differential output current characteristics of the triple-tail cell of FIG. 9 with respect to the input voltage $V_i$.

The transconductance characteristic of the cell is obtained by differentiating the equation (18a), (18b) and (18c) by the input voltage $V_i$ as $$\left. \frac{d(\Delta I_D)}{dV_i} \right|_{V_i=0} = \quad (19)$$

Figure 12:
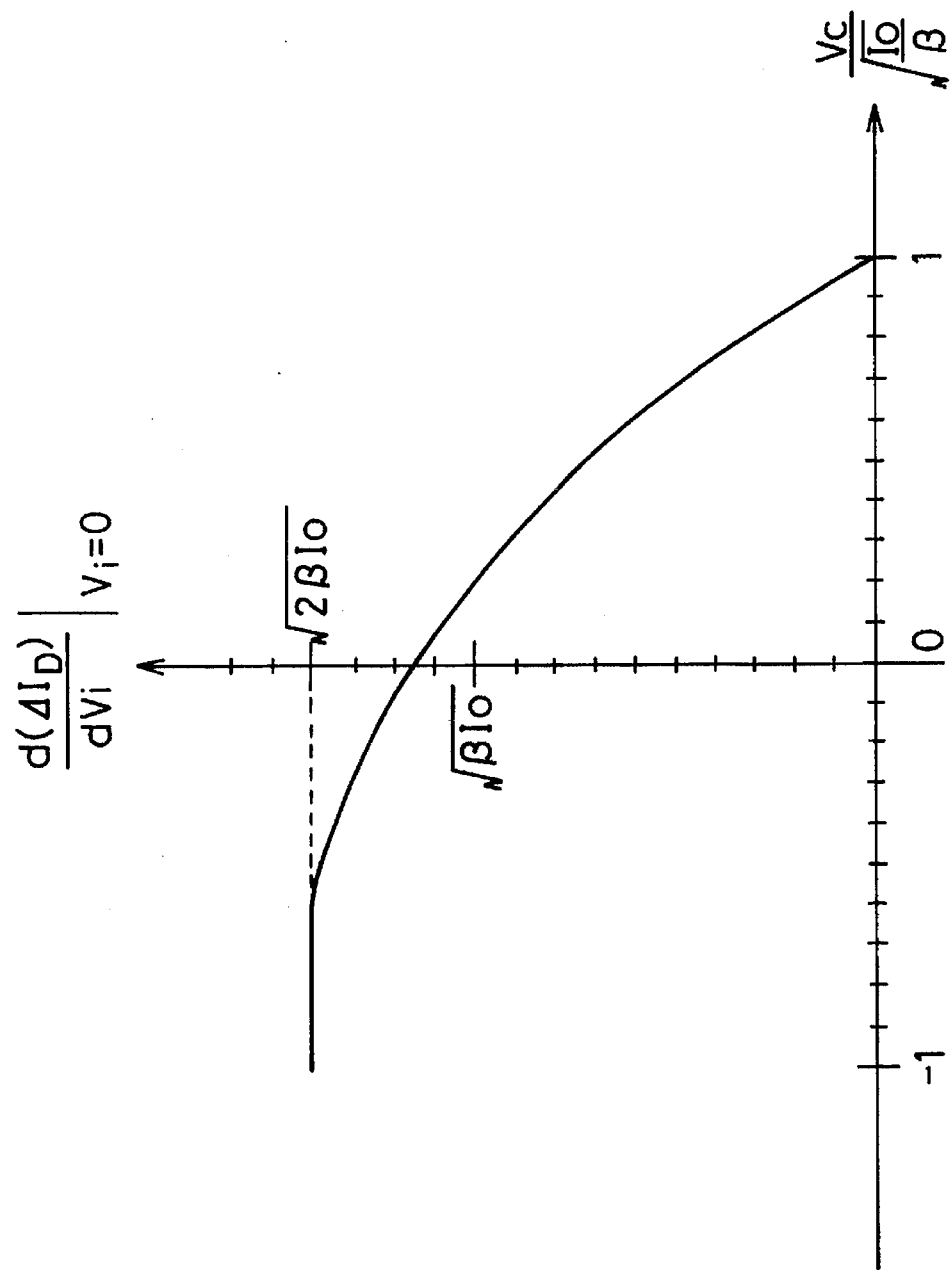
FIG. 12 is a graph showing the short-circuit transconductance characteristics of the triple-tail cell of FIG. 9 with respect to the input voltage $V_i$.

FIG. 12 shows the transfer characteristics of the triple-tail cell of FIG. 9 with respect to the input voltage $V_i$.

It is seen from FIGS. 10 and 11 that the differential output current $\Delta I$ varies dependent upon the dc control voltage $V_c(=V_b-V_R)$ and as a result, the short-circuit transconductoance can be varied by the voltage $V_c$.

The transconductance characteristic of the triple-tail cell of FIG. 9 for small signal applications is shown in FIG. 12.

The obtainable voltage gain for the small signal applications can be varied from the maximum value of $(\alpha_F I_o R_L/V_T)$ to the minimum value of 0 by changing the value of the control voltage $V_c$.

The rectified output current $I_{SQ}$ of the cell is expressed by the following equations (20a), (20b) and (20c) as $$I_{SQ} = I_{D3} \quad (20a)$$

$$= -\beta \left[ \frac{KV_i^2}{2(K+2)} + \frac{2K(K-2)}{(K+2)^2} V_C^2 + \frac{4KV_C}{(K+2)^2} \sqrt{\frac{(K+2)I_0}{\beta} - \frac{(K+2)}{2} V_i^2 - 2KV_C^2} \right] + \frac{KI_0}{(K+2)}$$

$$\left( |V_i| \leq \sqrt{\frac{2I_0}{\beta} - 4V_C^2} \;,\; |V_i| \leq \frac{-2KV_C + 2\sqrt{\frac{(K+4)I_0}{\beta} - 4KV_C^2}}{(K+4)} \right)$$

$$I_{SQ} = I_{D3} \quad (20b)$$

$$= -\frac{K\beta(|V_i|-V_C)}{2(K+2)^2} \sqrt{\frac{(K+2)I_0}{\beta} - K(|V_i|-V_C)^2} + \frac{(K+1)}{2(K+1)} I_0 - \frac{\beta K(K-1)(|V_i|-2V_C)^2}{(K+2)^2}$$

$$\left( \min\left\{ \sqrt{\frac{2I_0}{\beta} - 4V_C^2} \;,\; \frac{-2KV_C + \sqrt{\frac{(K+4)I_0}{\beta} - 4KV_C^2}}{(K+4)} \right\} \leq |V_i| \leq 2\sqrt{\frac{I_0}{\beta}} \right)$$

$$I_{SQ} - I_{D3} = 0 \quad \left( 2\sqrt{\frac{I_0}{\beta}} \leq |V_i| \right) \quad (20c)$$

Similar to the first embodiment, it is seen from FIG. 10 that the current $I_{SQ}$ has a full-wave rectification characteristic and is variable by the control voltage $V_c$. Therefore, the temperature dependency of the current $I_{SQ}$ can be cancelled by changing the dc control voltage $V_c$.

It is also seen that the input voltage range enabling the ideal square-law characteristic is given within the following input voltage range as $$|V_i| \leq \min\left\{\sqrt{\frac{2I_0}{\beta} - 4V_C^2}, \frac{-2KV_C + 2\sqrt{\frac{(K+4)I_0}{\beta} - \frac{4K}{V_C^2}}}{(K+4)}\right\} \quad (21)$$

Unlike the bipolar amplifier circuit of the first embodiment, the square-law characteristic does not vary dependent upon the voltage $V_c$, because the coefficient of the square term : $[K/\{(2(K+2)\}]$ in the equation (20a) is a constant.

Figure 13:
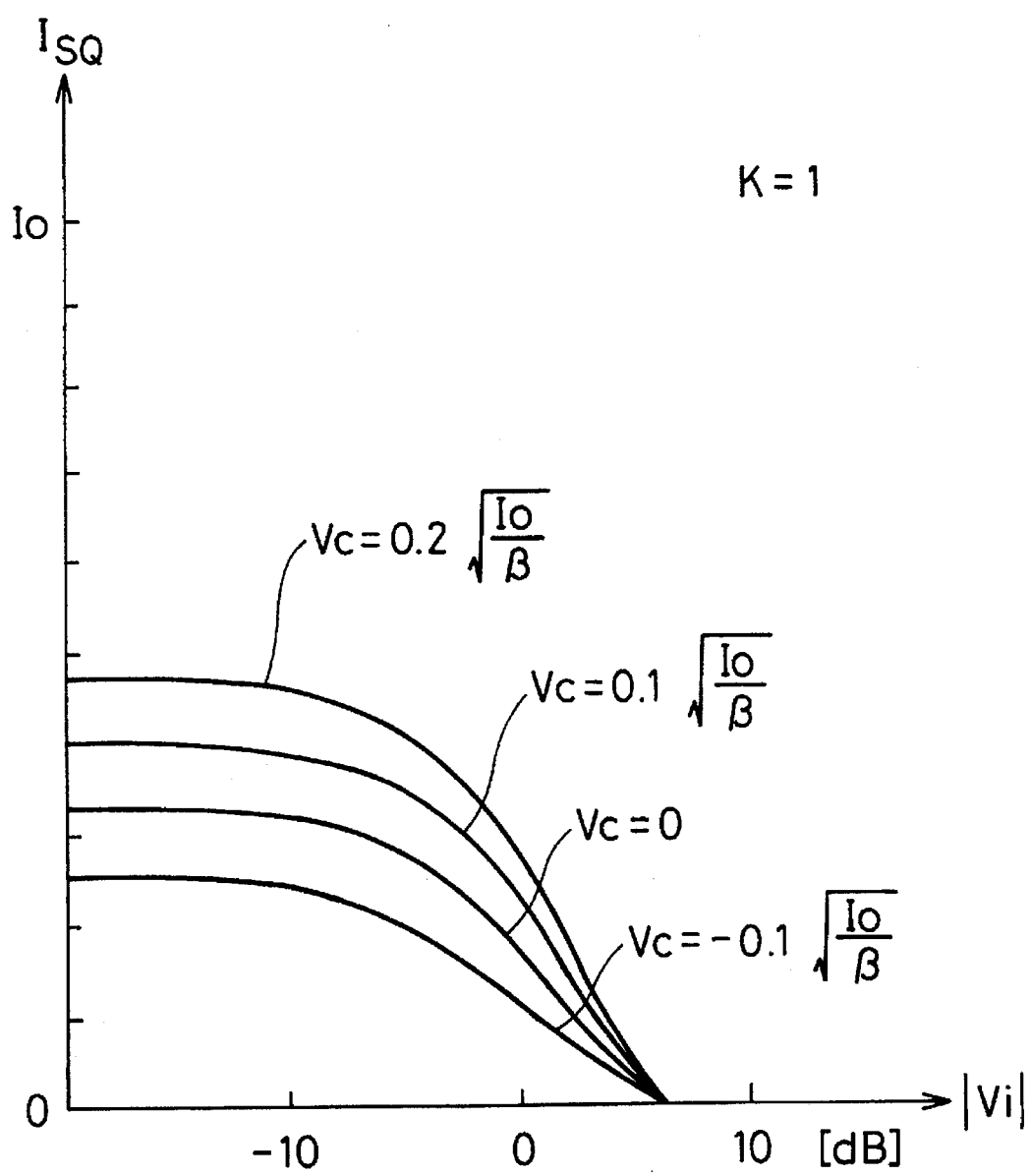
FIG. 13 is a graph showing the rectified current characteristics of the triple-tail cell of FIG. 9 with respect to the input voltage $V_i$, which are illustrated in decibel (dB) scale.

FIG. 13 shows the rectified output current characteristics of the triple-tail cell of FIG. 9 with respect to the input voltage $V_i$, which are illustrated in dB scale.

Similar to the first embodiment, it is seen From FIG. 13 that the rectified output current $i_{SQ}$ has an input dynamic range equal to or greater than 10 dB. The respective logarithmic characteristics of the triple-tail cells $A_1$ to $A_N$ in the first to N-th stages are defined by their corresponding voltage gains, thereby changing the superposition of the respective output currents $I_{SQ}$. The total logarithmic characteristic of the amplifier circuit is defined by superposition of the logarithmic characteristics in the first to N-th stages.

As a result, by adjusting the value of the control voltage $V_c$, the logarithmic amplification characteristics can be changed.

In this second embodiment, in consideration with the operating input voltage range, the logarithmic input dynamic range is approximately 8 dB. Therefore, satisfactory logarithmic accuracy can be obtained if the voltage gain of the differential pair of the transistors M1 and M2 is set at approximately 8 dB.

As described above, in the logarithmic amplifier circuit according to the second embodiment, the same advantage as those in the first embodiment can be obtained.

THIRD EMBODIMENT

Figure 14:
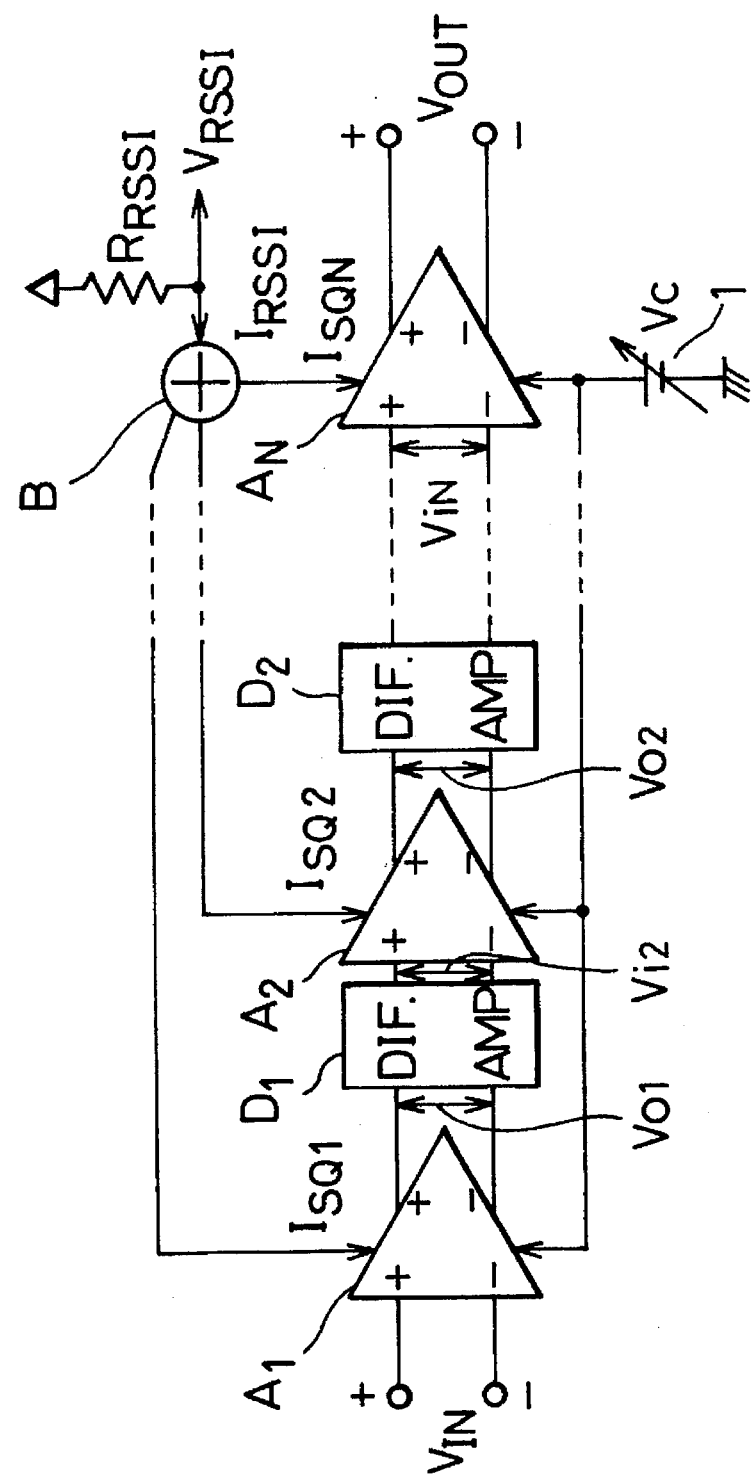
FIG. 14 is a block diagram showing the schematic circuit configuration of a logarithmic amplifier circuit according to a third embodiment of the present invention.

FIG. 14 shows a logarithmic amplifier circuit according to a third embodiment, which has the same configuration as that of the first embodiment except that (N-1) differential amplifiers Dn are additionally provided where n is an integer greater than unity. The adjoining triple-tail cells are connected through a corresponding one of the differential amplifiers $D_1, D_2, \ldots, D_{N-1}$. Each of the amplifiers $D_n$ has an input offset.

Figure 16:
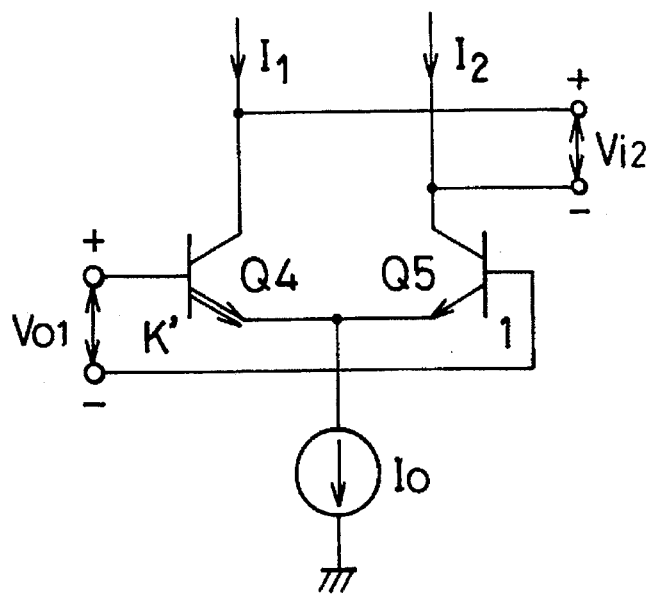
FIG. 16 is an example of bipolar differential amplifiers that are used for the third embodiment.
Figure 17:
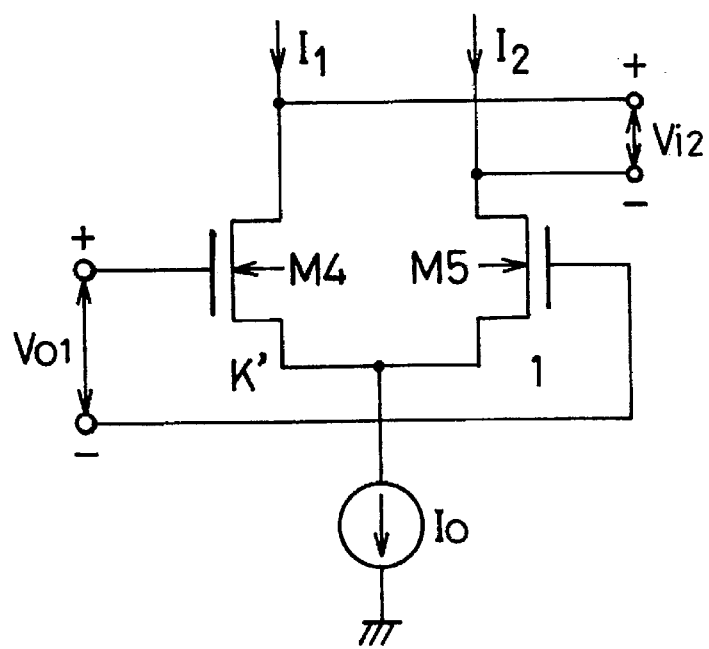
FIG. 17 is an example of MOS differential amplifiers 10 that are used for the third embodiment.

FIGS. 16 and 17 show unbalanced bipolar and MOS differential amplifiers, respectively, to be used for the third embodiment.

In FIG. 16, npn-type bipolar transistors Q4 and Q5 have an emitter area ratio of K' (K'>1). In this case, the input offset voltage $V_K$ is expressed as $V_K = V_T \ln(K')$.

When K is set as unity (i.e., K=1) in the bipolar triple-tail cell of FIG. 3, the offset voltage is approximately equal to $\pm V_T$ under the condition of $V_c=0$. Therefore, if the value of K' is set at $e^2$ ($\approx 2.71828$), the offset voltage can scarcely be cancelled.

In FIG. 17, n-channel MOS transistors M4 and M5 have a ratio (W/L) of K'. Also in this case, the input offset voltage $V_K$ can scarcely be cancelled.

In the third embodiment, any one of the cells shown FIGS. 3 and 9 may be used as each triple-tail cell. The same advantage as those in the first embodiment can be obtained.

FOURTH EMBODIMENT

Figure 15:
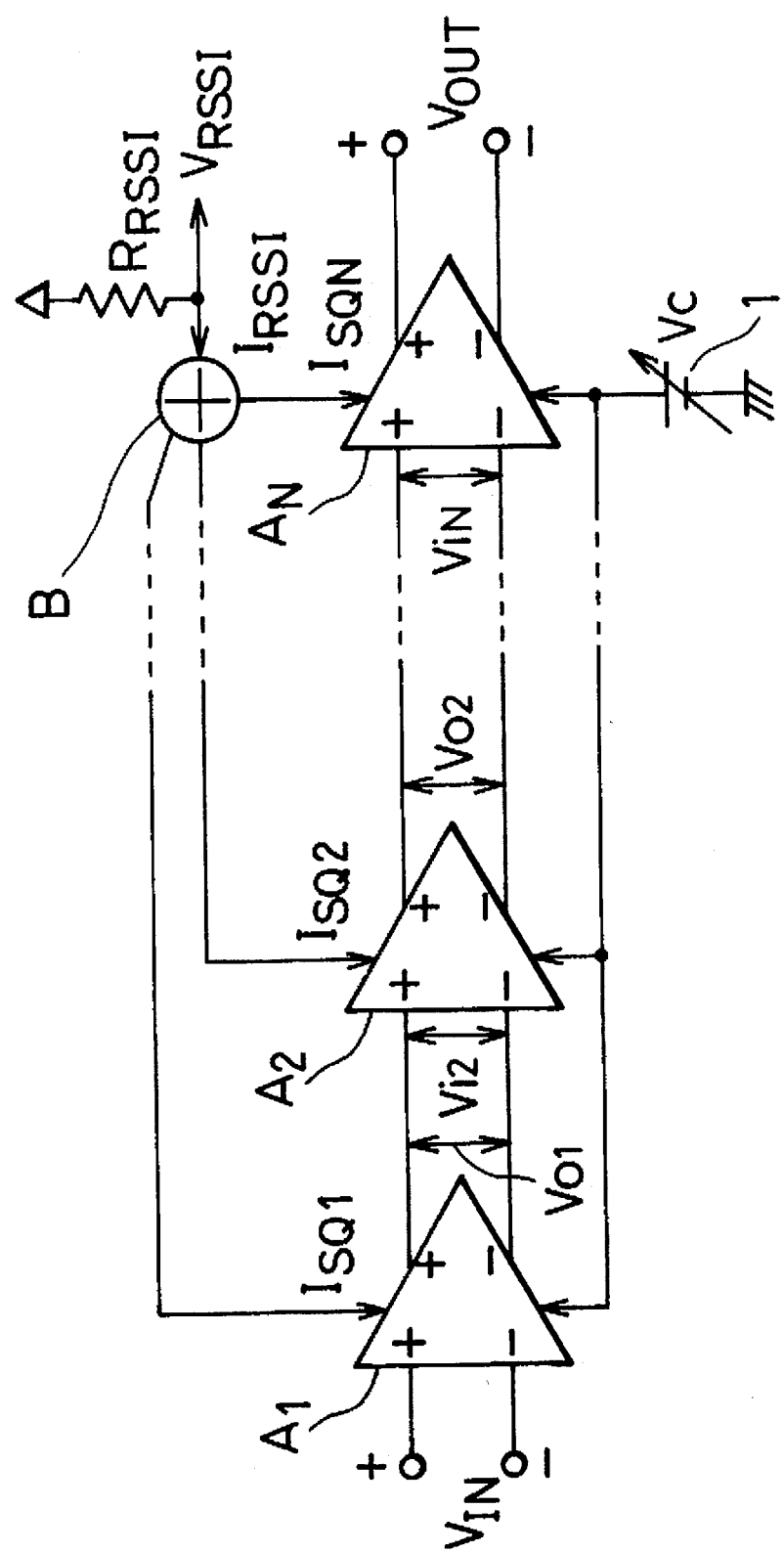
FIG. 15 is a block diagram showing the schematic circuit configuration of a logarithmic amplifier circuit according to a fourth embodiment of the present invention.

FIG. 15 shows a logarithmic amplifier circuit according to a fourth embodiment, which has the same configuration as that of the first embodiment except that the capacitors 2 are cancelled and the triple-tail cells $A_1$ to $A_N$ are directly connected to each other.

In this embodiment, the amplified output voltages $V_{OUT}$ of the cells tend to saturate from the N-th stage to the first stage. Therefore, the in triple-tail cell the last stage operates under a large swing mode, and as a result, the amplitude of the current which flows alternately through the transistors Q1 and Q2 (or, M1 and M2) varies within the range from zero to $I_o$. Thus, the value of the dc voltage applied to the cell in the subsequent stage varies from $[V_{cc}-(\alpha_F I_o R_L)/2]$ or $[V_{DD}=(I_o R_L)/2)]$ to zero.

The applied dc offset voltage from the triple-tail cell in the preceding stage may be treated as the original dc level of the cell concerned, because the total rectified output current $I_{RSSI}$ is equal to the sum of the rectified output currents $I_{SQ}$ to $I_{SQN}$.

In the fourth embodiment, any one of the cells shown FIGS. 3 and 9 may be used as each triple-tail cell. The same advantage as those in the first embodiment can be obtained.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A logarithmic amplifier circuit for amplifying an initial input signal comprising:

(a) a first triple-tail cell for receiving said initial input signal to produce a first rectified output signal and a first amplified output signal;

said first triple-tail cell including first, second and third transistors whose emitters or sources are coupled together, said first and second transistors forming a first differential pair;

said first differential pair and said third transistor being driven by a single tail current;

bases or gates of said first and second transistors forming input ends of said first triple-tail cell to be applied with said initial input signal;

collectors or drains of said first and second transistors forming output ends of said first triple-tail cell from which said first amplified output signal is derived;

said first rectified output signal being outputted through a collector or drain of said third transistor;

a base or gate of said third transistor being applied with a dc tuning voltage;

(b) a second triple-tail cell for receiving said first amplified output signal of said first triple-tail cell to produce a second rectified output signal and a second amplified output signal;

said second triple-tail cell including fourth, fifth and sixth transistors whose emitters or sources are coupled together, said fourth and fifth transistors forming a second differential pair;

said second differential pair and said sixth transistor being driven by a single tail current;

bases or gates of said fourth and fifth transistors forming input ends of said second triple-tail cell to be applied with said first amplified output signal;

collectors or drains of said fourth and fifth transistors forming output ends of said second triple-tail cell from which said second amplified output signal is derived;

said second rectified output signal being outputted through a collector or drain of said sixth transistor;

a base or gate of said sixth transistor being applied with said dc tuning voltage;

(c) an adder for adding said first rectified output signal and said second rectified output signal.

2. A circuit as claimed in claim 1, wherein said first and second triple-tail cells are cascade connected through a differential amplifier circuit with an input offset.

3. A circuit as claimed in claim 1, wherein said first and second triple-tail cells are cascade connected directly.

4. A logarithmic amplifier circuit for amplifying an initial input signal comprising:

(a) first to n-th triple-tail cells cascade connected, where n is an integer greater than or equal to two;

(b) said first triple-tail cell receiving said initial input signal to produce a first rectified output signal and a first amplified output signal;

said first triple-tail cell including first, second and third transistors whose emitters or sources are coupled together, said first and second transistors forming a first differential pair;

said first differential pair and said third transistor being driven by a single tail current;

bases or gates of said first and second transistors forming input ends of said first triple-tail cell to be applied with said initial input signal;

collectors or drains of said first and second transistors forming output ends of said first triple-tail cell from which said first amplified output signal is derived;

said first rectified output signal being outputted through a collector or drain of said third transistor;

a base or gate of said third transistor being applied with a dc tuning voltage;

(c) said second to n-th triple-tail cells receiving said amplified output signals of said first to (n-1)-th triple-tail cells to produce second to n-th rectified output signals and second to n-th amplified output signals, respectively;

each of said second to n-th triple-tail cells including of fourth, fifth and sixth transistors whose emitters or sources are coupled together, said fourth and fifth transistors forming a second differential pair;

said second differential pair and said sixth transistor being driven by a single tail current;

bases or gates of said fourth and fifth transistors forming input ends of said second triple-tail cell to be applied with said first amplified output signal of said first triple-tail cell;

collectors or drains of said fourth and fifth transistors forming output ends of said second triple-tail cell from which a corresponding one of said second to n-th amplified output signals is derived;

a corresponding one of said second to n-th rectified output signal being outputted through a collector or drain of said sixth transistor;

a base or gate of said sixth transistor being applied with said dc tuning voltage; and (c) an adder for adding said first to n-th rectified output signals.

5. A circuit as claimed in claim 4, wherein said first to n-th triple-tail cells are cascade connected through n-1 differential amplifier circuits with input offsets, respectively.

6. A circuit as claimed in claim 4, wherein said first to n-th triple-tail cells are cascade connected directly.

* * * * *